(12) United States Patent
Bedell et al.

(10) Patent No.: US 8,169,025 B2
(45) Date of Patent: May 1, 2012

(54) STRAINED CMOS DEVICE, CIRCUIT AND METHOD OF FABRICATION

(75) Inventors: Stephen W. Bedell, Yorktown Heights, NY (US); Kangguo Cheng, Albany, NY (US); Bruce B. Doris, Yorktown Heights, NY (US); Ali Khakifirooz, Albany, NY (US); Devendra K. Sadana, Yorktown Heights, NY (US); Ghavam G. Shahidi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 284 days.

(21) Appl. No.: 12/689,339

(22) Filed: Jan. 19, 2010

(65) Prior Publication Data

US 2011/0175166 A1    Jul. 21, 2011

(51) Int. Cl.
*H01L 27/12* (2006.01)
(52) U.S. Cl. ..... 257/351; 438/154; 438/283; 257/E21.7; 257/E21.111
(58) Field of Classification Search .................. 257/351, 257/E21.7, E27.111; 438/154, 283
See application file for complete search history.

(56) References Cited

U.S. PATENT DOCUMENTS

| | | | |
|---|---|---|---|
| 6,815,278 B1 | 11/2004 | Ieong et al. | |
| 7,098,508 B2 | 8/2006 | Ieong et al. | |
| 7,271,043 B2 | 9/2007 | Zhu et al. | |
| 7,279,756 B2 | 10/2007 | Wang et al. | |
| 7,307,273 B2 | 12/2007 | Currie | |
| 7,361,539 B2 | 4/2008 | Chen et al. | |
| 7,615,806 B2 * | 11/2009 | Thean et al. | 257/206 |
| 8,008,751 B2 * | 8/2011 | Irisawa et al. | 257/627 |
| 2005/0285187 A1 | 12/2005 | Bryant et al. | |
| 2006/0266996 A1 | 11/2006 | Irisawa et al. | |
| 2007/0111417 A1 | 5/2007 | Bryant et al. | |
| 2007/0221956 A1 * | 9/2007 | Inaba | 257/197 |
| 2007/0262361 A1 | 11/2007 | Zhu et al. | |
| 2007/0262385 A1 | 11/2007 | Nguyen et al. | |
| 2008/0124858 A1 | 5/2008 | Nguyen et al. | |
| 2008/0135886 A1 * | 6/2008 | Irisawa et al. | 257/255 |
| 2008/0191281 A1 * | 8/2008 | Chidambarrao et al. | 257/351 |

OTHER PUBLICATIONS

Ghani, T., et al. "A 90NM High Volume Manufacturing Logic Technology Featuring Novel 45NM Gate Length Strained Silicon CMOS Transistors" 2003 IEEE. IEEE International Electron Devices Meeting, 2003, IEDM 2003 Technical Digest, Dec. 2003. pp. 978-980.

Harris, H., et al. "Band-Engineered Low PMOS VT with High-κ/Metal Gates Featured in a Dual Channel CMOS Integration Scheme" 2007 Symposium on VLSI Technology Digest of Technical Papers, Jun. 2007. pp. 154-155.

Hashemi, P., et al. "Electron Transport in Gate-All-Around Uniaxial Tensile Strained-Si Nanowire N-MOSFETS." IEDM 2008. IEEE International Electron Device Meeting (IEDM'08). Dec. 2008. (4 Pages).

(Continued)

*Primary Examiner* — Trung Q Dang
(74) *Attorney, Agent, or Firm* — Tutunjian & Bitetto, P.C.; Louis J. Percello, Esq.

(57) ABSTRACT

A semiconductor device and fabrication method include a strained semiconductor layer having a strain in one axis. A long fin and a short fin are formed in the semiconductor layer such that the long fin has a strained length along the one axis. An n-type transistor is formed on the long fin, and a p-type transistor is formed on the at least one short fin. The strain in the n-type transistor improves performance.

24 Claims, 7 Drawing Sheets

OTHER PUBLICATIONS

Irisawa, T., et al. "Electron Transport Properties of Ultrathin-Body and Tri-Gate SOI NMOSFETS with Biaxial and Uniaxial Strain" International Electron Devices Meeting, IEDM '06. Dec. 2006. (4 Pages).

Irisawa, T., et al. "High-Performance Uniaxially Strained SiGe-on-Insulator PMOSFETS Fabricated by Lateral-Strain-Relaxation Technique" 2006 IEEE. IEEE Transactions on Electron Devices, vol. 53, No. 11. Nov. 2006. pp. 2809-2815.

Irisawa, T., et al. "Uniaxially Strained SGOI and SSOI Channels for High Performance Multi-Gate CMOS", Symp. ECS. Third International SiGe, Ge, & Related Compounds Symposium. Oct. 2008 (1 Page).

Loo, R., et al. "Selective Epitaxial Si/SiGe for VT Shift Adjustment in High-κ PMOS Devices" Semiconductors Science and Technology. Jan. 2007. pp. S110-S113.

Luo, Z., et al. "High Performance and Low Power Transistors Integrated in 65NM Bulk CMOS Technology" 2004 IEEE International Conference on Services Computing (SCC 2004). Sep. 2004. pp. 661-664.

Luo, Z., et al. "High Performance Transistors Featured in Aggressively Scaled 45NM Bulk CMOS Technology" 2007 Symposium on VLSI Technology Digest of Technical Papers. Jun. 2007. pp. 16-17.

Nguyen, B., et al. "Uniaxial and Biaxial Strain for CMOS Performance Enhancement" 2006 IEEE. 2006 IEEE International Conference on Services Computing (SCC 2006). Sep. 2006. (3 Pages).

Ren, Z., et al. "On Implementation of Embedded Phosphorus-Doped SIC Stressors in SOI NMOSFETS" 2008 Symposium on VLSI Technology Digest for Technical Papers. Jun. 2008. pp. 172-173.

Rim, K., et al. "Characteristics and Device Design of Sub-100 nm Strained Si N- and PMOSFETS," 2002 Symposium on VLSI Technologies Digest of Technical Papers. Jun. 2002. pp. 98-99.

Shi, Z., et al. "Mobility Enhancement in Surface Channel SiGe PMOSFETS With $HfO_2$ Gate Dielectrics." 2003 IEEE. IEEE Electron Device Letters. vol. 24, No. 1, Jan. 2003. pp. 34-36.

Thean, A., et al., "Strain-Enhanced CMOS Through Novel Process-Substrate Stress Hybridization of Super-Critically Thick Strained Silicon Directly on Insulator (SC-SSOI)". 2006 Symposium on VLSI Technology Digest of Technical Papers. Jun. 2006. pp. 130-131.

Weber, O., et al. "55nm High Mobility SiGe(:C) PMOSFETS With HFO2 Gate Dielectric and Tin Metal Gate for Advanced CMOS" 2004 Symposium on VSLI Technology Digest of Technical Papers. Jun. 2004, pp. 42-43.

Yin, H., et al., "Integration of Local Stress Techniques With Strained-Si Directly on Insulator (SSDOI) Substrates" Symposium on VSLI Technology Digest of Technical Papers, Jun. 2006. pp. 76-77.

Yin, H., et al., "Uniaxial Strain Relaxation on Ultra-Thin Strained-Si Directly on Insulator (SSDOI) Substrates" 2006 IEEE. ICSICT. 8th International Conference on Solid-State and Integrated Circuit Technology. Oct. 2006. pp. 136-138.

* cited by examiner

FIG. 5B ShortFin

FIG. 5A Long Fin

STRAINED CMOS DEVICE, CIRCUIT AND METHOD OF FABRICATION

BACKGROUND

1. Technical Field

The present invention relates to semiconductor devices and processes, and more particularly to strained semiconductor materials suitable for different polarity devices on a same substrate.

2. Description of the Related Art

Strained silicon is being used by the semiconductor industry to improve transistor performance. Increased strain levels are desired in future technology nodes (e.g., 32 nm and beyond) to continue to improve transistor performance. In general, there are two methods to apply strain on devices: global and local strain engineering. Global biaxial tensile strain can be readily achieved by growing Si on relaxed SiGe buffer layers, which are grown epitaxially on a Si wafer. However, biaxial tensile strain offers a small enhancement in transistor performance (See, e.g., K. Rim. et al., "Characteristics and device design of sub-100 nm strained Si N- and PMOSFETs," Symp. VLSI Technol., pp. 98-99, 2002.).

Local strain engineering is the standard method to exert uniaxial tensile and compressive strain on n-channel and p-channel metal oxide semiconductor field effect transistors (MOSFETs), respectively (see, e.g., X. Chen et al., U.S. Pat. No. 7,361,539). Uniaxial tensile strain can be obtained, for example, by depositing a nitride layer on the transistor (as described e.g. in U.S. Pat. No. 7,361,539) or by forming embedded SiC source/drain structures (See, e.g., Z. Ren, et al., "On implementation of embedded phosphorus-doped SiC stressors in SOI nMOSFETs", Symp. VLSi Tech., pp. 172-173, 2008). Uniaxial compressive strain is achieved by either depositing nitride layers (e.g., U.S. Pat. No. 7,361,539) or by embedded SiGe (see e.g. T. Ghani et al., "A 90 nm high volume manufacturing logic technology featuring novel 45 nm gate length strained silicon CMOS transistors", IEDM Tech. Dig., p 11.6.1, 2003). Both methods loose their effectiveness as the technology is scaled and the transistor pitch becomes smaller (Z. Luo et al., "High performance transistors featured in aggressively scaled 45nm bulk CMOS technology", Symp VLSI Tech., pp. 16-17, 2007).

Furthermore, a dual stress liner (DSL) method, where nitride layers with opposite strains are deposited on n- and p-channel transistors leads to significant process complication and faces great challenges in future technology nodes. To increase the transistor performance in the future technology nodes, the amount of strain transferred to the transistors needs to be increased.

One way to increase the strain is to combine the global biaxial tensile strain, for example, in a strained silicon directly on insulator (SSDOI) structure, with local strain engineering. While biaxial tensile strain has a small beneficial effect on NFET performance, it deteriorates PFET device performance. Hence, there are several proposals to relax the biaxial tensile strain on PFETs by optimizing the layout or by amorphizing the source/drain regions of the PFETs via proper ion implantation and subsequent annealing.

To benefit even more from global strain engineering, it is desired that the biaxial strain is converted to uniaxial strain by preferential relaxation of the strain. Electron mobility enhancement up to 100% is achieved if biaxial tensile strain in SSDOI is converted into uniaxial strain by proper layout design. The methods proposed by T. Irisawa, et al., "Electron Transport Properties of Ultrathin-body and Tri-gate SOI nMOSFETs with Biaxial and Uniaxial Strain", IEDM Tech. Dig., 2006), and P. Hashemi et al., "Electron Transport in Gate-All-Around Uniaxial Tensile Strained-Si Nanowire n-MOSFETs"IEDM 2008 use large anchor structures at the end of an active region (in a dog-bone structure) to hold the strain during device processing. Such structures impose severe area penalties and manufacturing cost.

The prior art does not provide a manufacturable solution to integrate NFET and PFET devices on a same chip. While transferring the global biaxial tensile strain into uniaxial tensile strain is advantageous for NFETs, it deteriorates PFET performance, among other things.

SUMMARY

A semiconductor device and fabrication method include a strained semiconductor layer having a strain in one axis. A long fin and a short fin are formed in the semiconductor layer such that the long fin has a strained length along the one axis. An n-type transistor is formed on the long fin, and a p-type transistor is formed on the short fin. The strain in the n-type transistor improves performance.

Another method for fabricating a semiconductor device includes providing a providing a Strained Silicon Directly on Insulator (SSDOI) wafer with biaxial tensile strain; patterning long fins and short fins in a semiconductor layer of the wafer such that the long fin has a strained length along its longitudinal axis, and the short fins having dimensions to substantially remove residual strain; forming n-type transistors on the long fins including gate structures and raised active area regions such that the gate structures and the raised active area regions provide anchoring to maintain strain in the strain length of the long fins; and forming p-type transistors on the short fins.

A semiconductor device includes a strained semiconductor layer fanned into at least one long fin and at least one short fin such that the at least one long fin has a strained length. An n-type transistor is formed on the at least one long fin wherein the strained length improves device operation. A p-type transistor is formed on the short fin.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
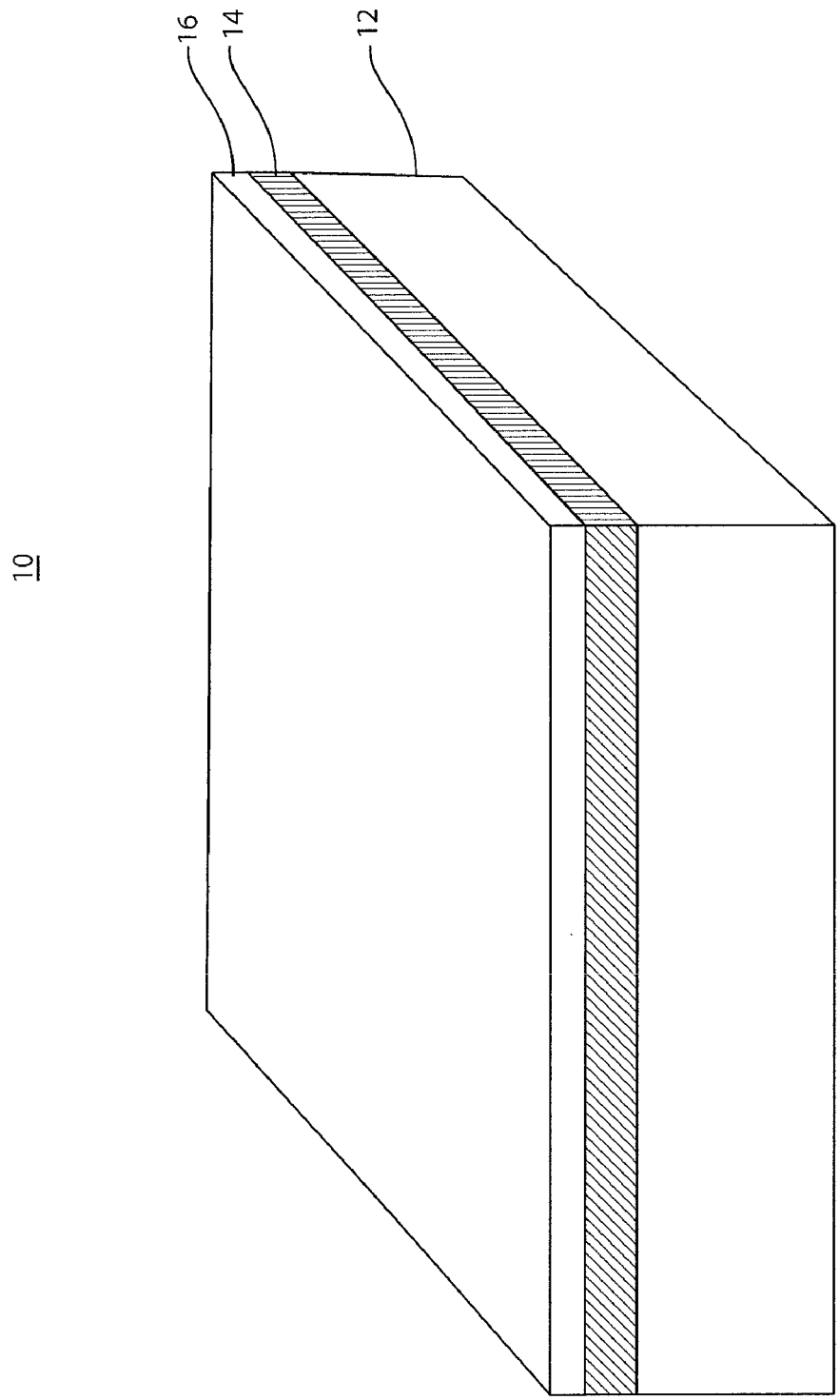
FIG. 1 is a perspective view of a semiconductor wafer having a strained semiconductor material.

In accordance with the present principles, a device, circuit and methods for fabricating both n-type field effect transistors (NFETs) and p-type field effect transistors (PFETs) on a same substrate with desired strains for both NFET and PFET devices is provided. In one embodiment, an n-channel metal oxide semiconductor field effect transistor (MOSFET) is fabricated on uniaxially strained Si, wherein the uniaxial tensile strain is achieved by preferential relaxation of global biaxial strain, and a p-channel MOSFET is fabricated on relaxed Si or uniaxially strained Si, wherein uniaxial strain is achieved by local strain engineering, and both device polarities are fabricated on the same substrate. Methods for fabricating these devices are also disclosed.

One way to achieve enhanced NFET and PFET performance on the same chip is to integrate uniaxially strained SiGe and Si islands on the same substrate, which uses preferential epitaxial growth or layer removal and/or additional wafer bonding. A dual-channel structure which includes uniaxially strained Si with tensile strain on top of a compressively strained SiGe is possible. Such devices may need to operate in a buried channel hole transport, which may lower the drive current and increase the leakage current of the transistors.

Strain can be converted to uniaxial tensile strain in the direction normal to the channel to enhance PFET performance. This method puts severe restrictions on the device layout and is useful for planar device structures.

In particularly useful embodiments, islands are formed on a Strained Silicon Directly on Insulator (SSDOI) wafer to preferentially relax the strain. Some regions of the wafer are patterned into long and narrow islands, where NFETs are later fabricated, while some part of the wafer is patterned into small islands, where PFETs are to be fabricated. This is performed as a part of shallow trench isolation (STI) or mesa isolation. If needed, individual NFETs can be separated after gate stack formation and raised source/drain epitaxy.

The present principles are applicable to FinFETs and Trigate device structures. Such structures are promising for transistor scaling in, e.g., 22 nm nodes and beyond, and provide superior short-channel control. When fabricated on conventional semiconductor-on-insulator (SOI) wafers, carrier transport is conducted along the (110) Si surface in a FinFET structure. The (110) surface has lower electron mobility compared to the (100) surface. On the other hand, hole mobility is enhanced for the same orientation. In other words, FinFETs are expected to yield weaker NFETs and stronger PFETs compared to planar structures. So, there is a need to improve electron transport for the FinFETs.

The present methods add at most one mask to normal the FinFET fabrication process. In a typical FinFET fabrication flow, fins are first patterned throughout the wafer, and individual devices are separated once the gate stack, spacer, and raised source/drain structure are formed. In accordance with the present principles, long fins are fabricated on a SSDOI wafer. Some of fins are then cut into smaller islands, and PFETs are fabricated on these islands. NFETs are fabricated on the long fins. Local strain engineering methods can be added to the process flow to further improve device performance.

The present embodiments are well suited for regular structures, such as static random access memory (SRAM) cells. In an SRAM structure, NFET devices (both pull-down and pass-gate) are fabricated on long and narrow islands, while PFET pull-up devices are fabricated on short islands. Hence, no additional processing step is needed to convert the biaxial tensile strain into uniaxial tensile strain in NFETs and relax the strain completely for PFETs. The strain from a substrate is relaxed in the PFET regions by cutting the fin or island. It may be possible to stress the PFET by other methods, e.g., stress liners or embedded SiGe, etc.

It is to be understood that the present invention will be described in terms of a given illustrative architecture formed on a wafer or substrate; however, other architectures, structures, substrate materials and process features and steps may be varied within the scope of the present invention.

Circuits as described herein may be part of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIG. 1, a perspective view of a strained-silicon directly on insulator (SSDOI) structure 10 is illustratively depicted. The SSDOI structure 10 includes a substrate 12, which may include bulk silicon, germanium, gallium arsenide or any other substrate material. On the substrate 12, a dielectric layer 14 is formed or grown. The dielectric layer 14 may include a buried oxide layer (BOX) or other dielectric material. A strained semiconductor material 16 is provided on the dielectric layer 14.

In a particularly useful embodiment, the strained semiconductor material 16 includes a biaxially tensile strained silicon layer. Other strained layers having different or the same materials may also be employed in accordance with the present principles. In this particular example, a global biaxial tensile strain in a strained-silicon directly on insulator (SSDOI) structure is converted to a uniaxial tensile strain for n-channel transistors and relaxed for p-channel transistors, so that uniaxial compressive strain can be effectively applied to p-channel transistors.

In one embodiment, the starting material is a biaxially strained silicon-on-insulator 16, which is usually fabricated by growing Si on relaxed SiGe buffer layers, wafer bonding, and subsequent removal of the Si substrate and SiGe layer. Such wafers are commercially available. For devices targeted for 32 nm node and beyond, the thickness of the strained layer 16 may be about 10-30 nm. Usually Ge content in a SiGe buffer layer is 20-30%, but higher Ge content is possible.

Figure 2:
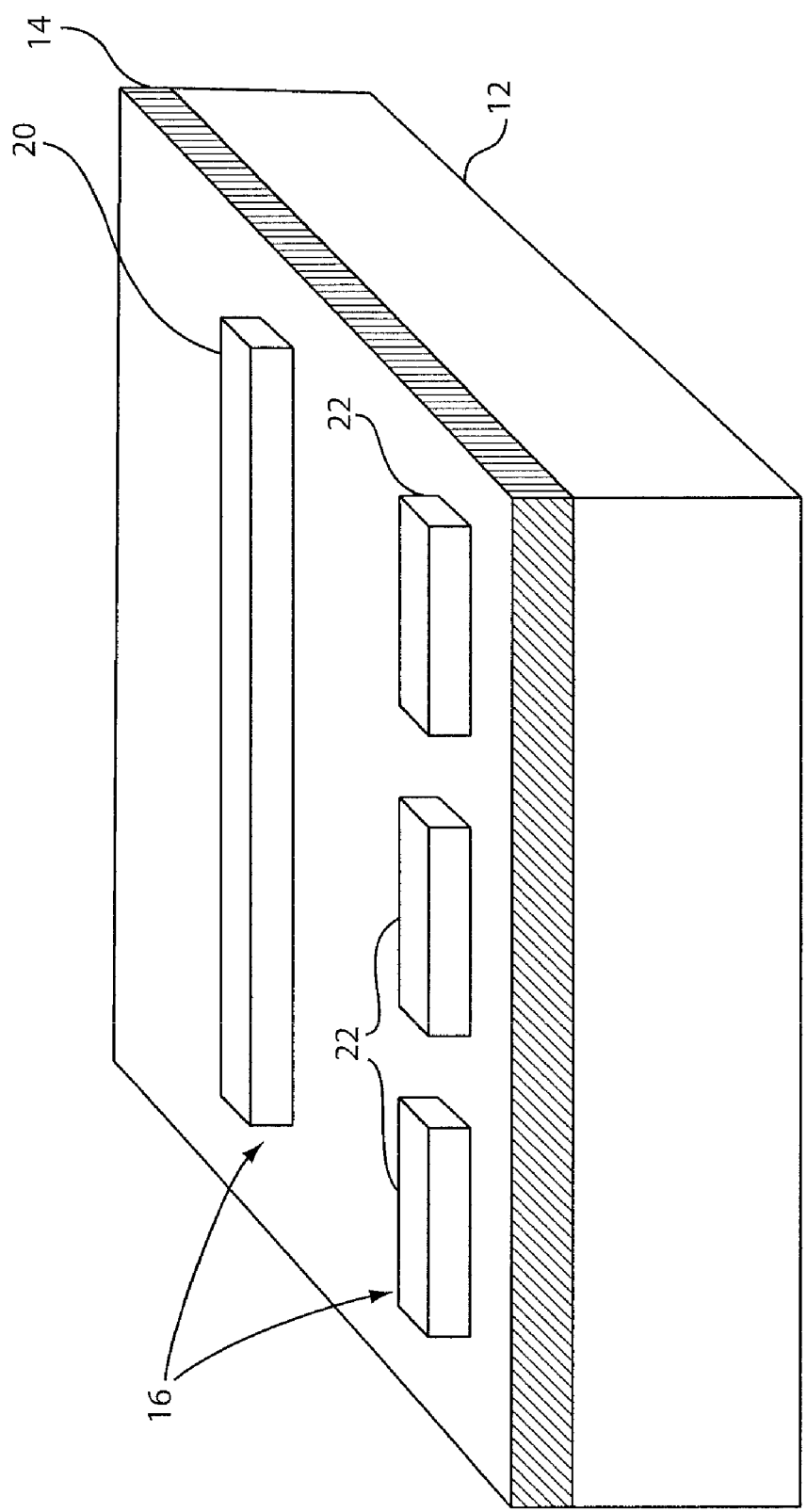
FIG. 2 is a perspective view of the strained semiconductor material formed into long and short fins or islands.

Referring to FIG. 2, to convert the global biaxial tensile strain of layer 16 into uniaxial tensile strain, the strained silicon layer 16 is patterned into islands 20 with length much larger than width and height. For planar structures, a set of long and narrow (e.g., having a width less than about 300 nm) islands 20 are patterned where NFETs are fabricated, and a set of small islands 22 are formed where PFETs are fabricated.

The small islands 22 may be formed from large islands 20, or the small islands 22 may be formed simultaneously with the large islands 20. Such processing may include depositing mask layers, patterning these layers and etching the material to form the large islands 20 and the small islands 22, simultaneously. Since the long islands 20 maintain their length, a uniaxial strain is maintained in the long dimension direction, but not in the width. For the small islands 22, the strain is relieved in the length and width directions.

For a FinFET device, with typical fin width and height of about 10-30 nm, the strain in the direction normal to the fin length is relaxed and the biaxial strain is instantly converted into uniaxial strain. Fins can be patterned either by direct photolithography, that may employ hard masks to transfer the pattern, and subsequent dry etching of Si. Alternatively, a so-called spacer patterning method can be used, to achieve higher fin density. To maintain the uniaxial tensile strain in NFETs, the fins should be longer than 1 micron and preferably extend 500 nm from each side of a position location where NFETs are to be fabricated. To relax the strain for PFETs, small island structures 22 preferably with length less than 300 nm are to be cut from the fins, and one or more PFETs (depending on the device pitch) are fabricated on each island 22.

Figure 3:
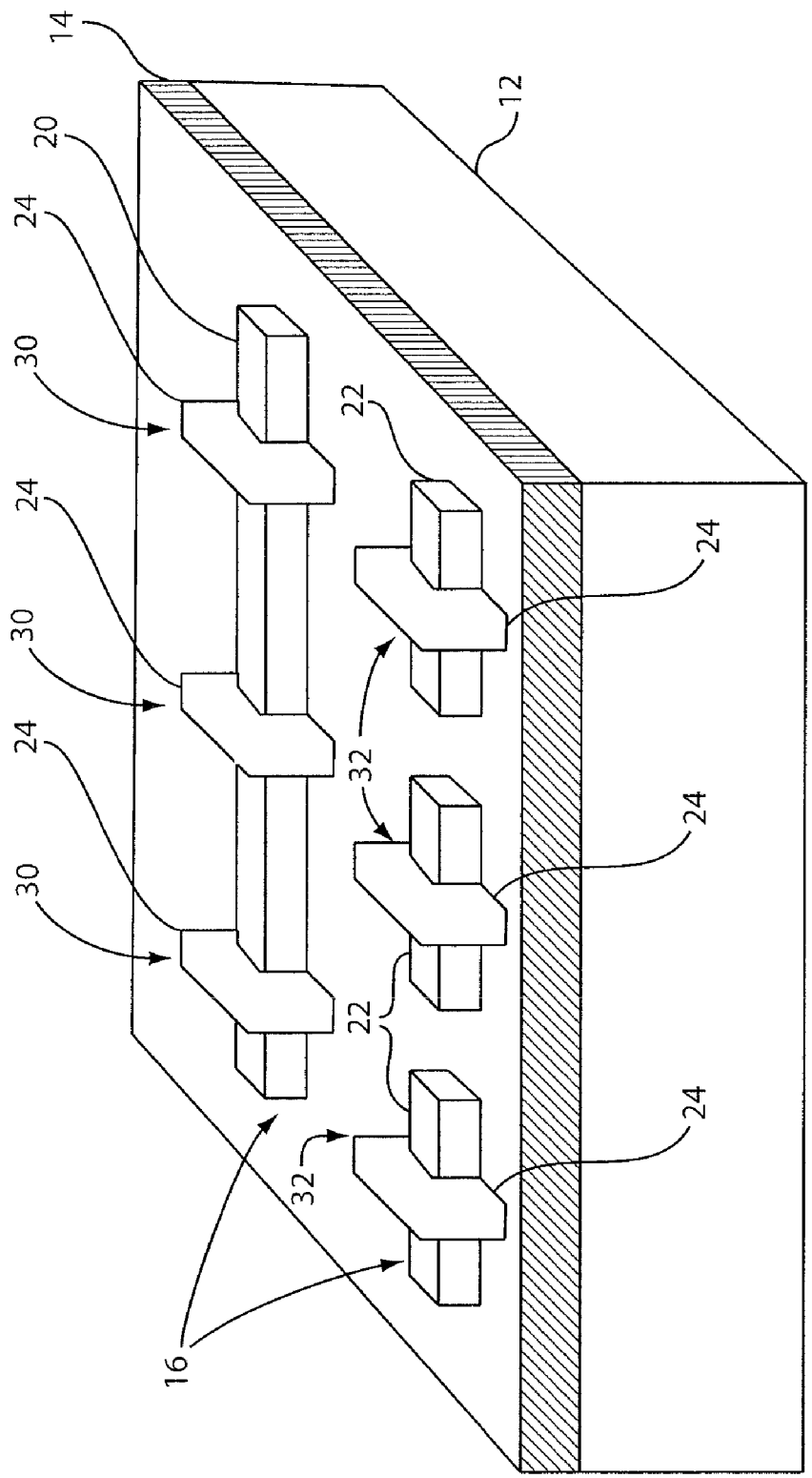
FIG. 3 is a perspective view of gate structures formed on the long and short fins.

Referring to FIG. 3, gate structures 24 are formed over the fins that form large islands 20 and small islands 22 to build transistors. The transistors include NFETs 30 and PFETs 32. The transistors are constructed in accordance with known processes. The gate structures include at least a gate dielectric material and a gate conductor. Gate dielectric material may include, e.g., silicon dioxide, silicon oxynitride, a high-k dielectric, etc. and is first grown or deposited on the fins of islands 20 and 22. Then, gate electrodes which may include polysilicon, metal, a combination of both, etc. are deposited and patterned to form gate structures 24. NFETs 30 and PFETs 32 may receive either identical or different gate stacks as desired to set the threshold voltage.

Figure 4:
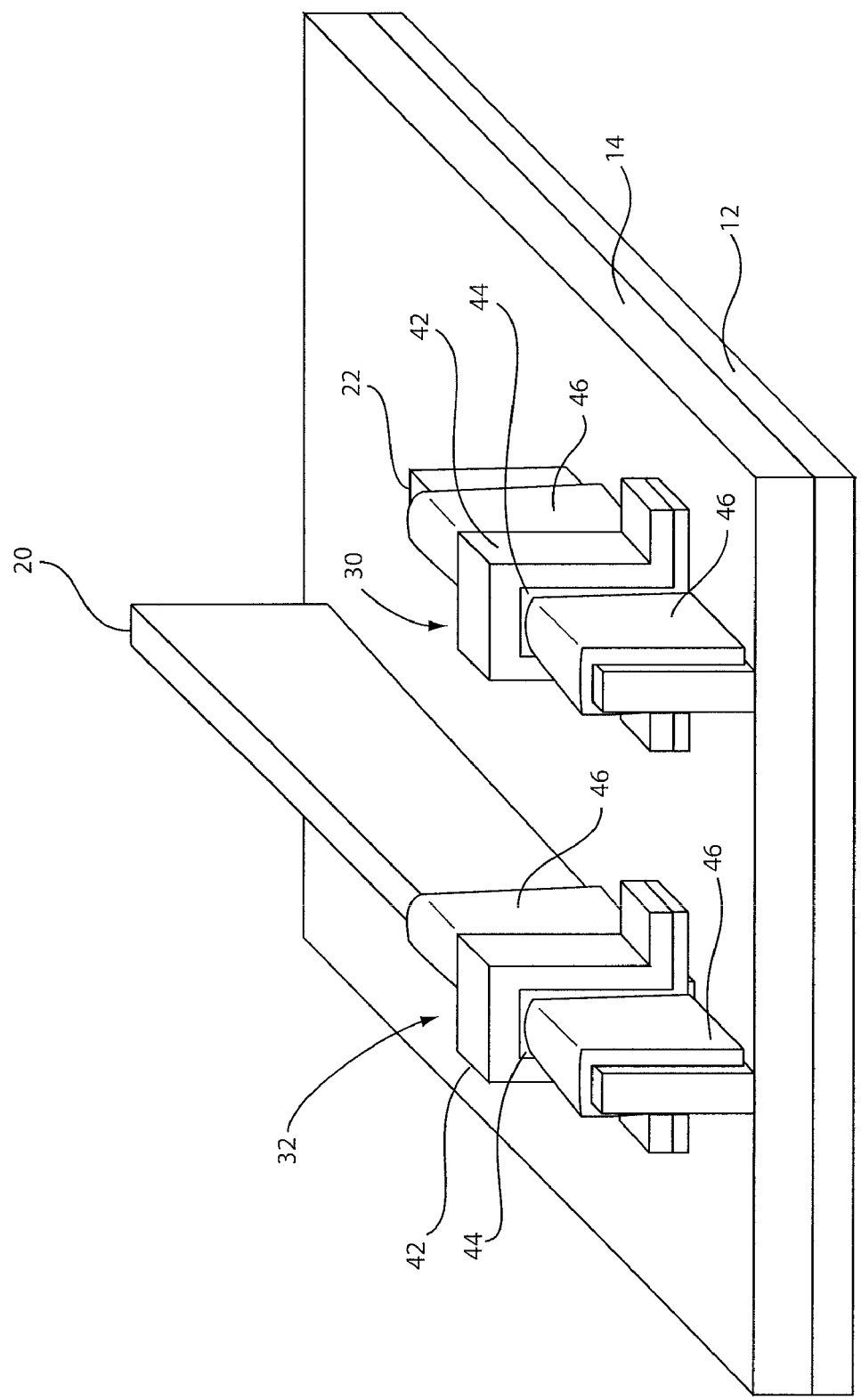
FIG. 4 is a perspective view showing a long fin and a short fin having gate structures formed thereon and raised source and drain regions which assist in anchoring the strain in the long fin.

Referring to FIG. 4, halo implants are made with proper species for NFETs 30 and PFETs 32 to adjust the threshold voltage and/or control short channel effects. An insulator is then deposited and patterned to form spacers (not shown) to show underlying components on sidewalls of a gate conductor 42 and gate dielectric 44. Raised source/drain structures 46 are preferably formed by selective epitaxy of, e.g., Si, SiC, or SiGe. Other materials or deposition processes may also be employed. However, it is desirable that the raised source/drain regions 46 are formed by epitaxy of Si or SiC for NFETs 30, and SiGe for PFETs 32.

After epitaxial growth, individual NFET devices 30 can be separated by etching the proper regions between raised source/drain regions 46 from the epitaxially grown Si and the underlying fin. Since the structures are now anchored to the source/drain epitaxy 46 and the gate stack 24, further device processing does not relax the strain.

If desired, conventional dual stress liners and/or embedded SiC and SiGe structures can be applied as described in prior art to further enhance transistor performance. For example, the short fins for the PFETS can be stressed locally by employing another technique (e.g., stress liners, etc.).

Figure 5:
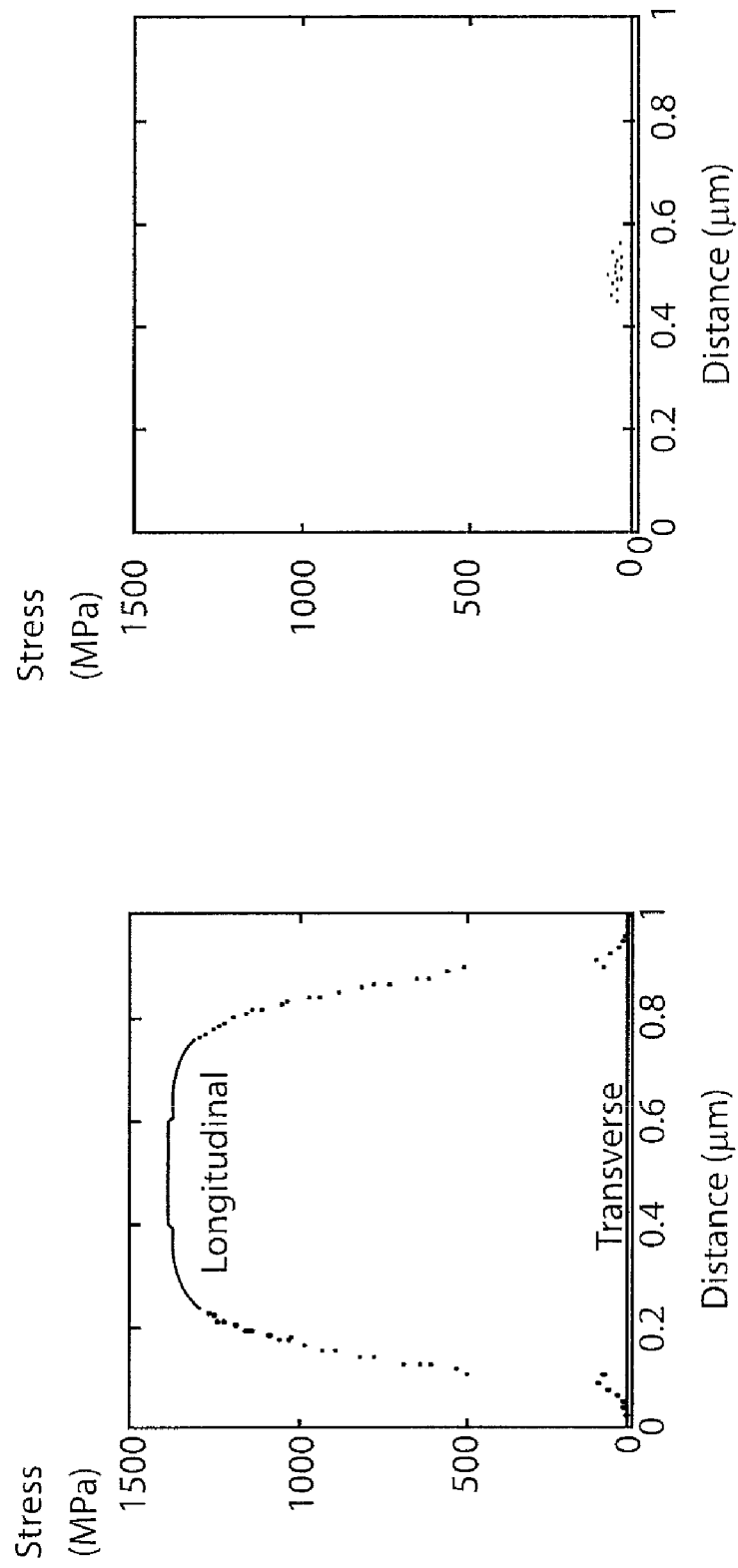
FIG. 5A is a plot showing longitudinal and transverse stress in a long fin.
FIG. 5B is a plot showing longitudinal and transverse stress in a short fin.

Referring to FIGS. 5A and 5B, simulated stress is plotted in the longitudinal direction (along the fin) and the transverse (normal to the fin) direction for long fins (FIG. 5A) and short fins (FIG. 5B). The stress is plotted after several device processing steps that involve etching, deposition, and annealing steps. Starting with a SSDOI wafer with a typical biaxial strain of 1%, the final longitudinal stress for the NFETs (fabricated on long fins) and PFETs (fabricated on short fins) is about 1400 MPa and 0 MPa, respectively.

Figure 6:
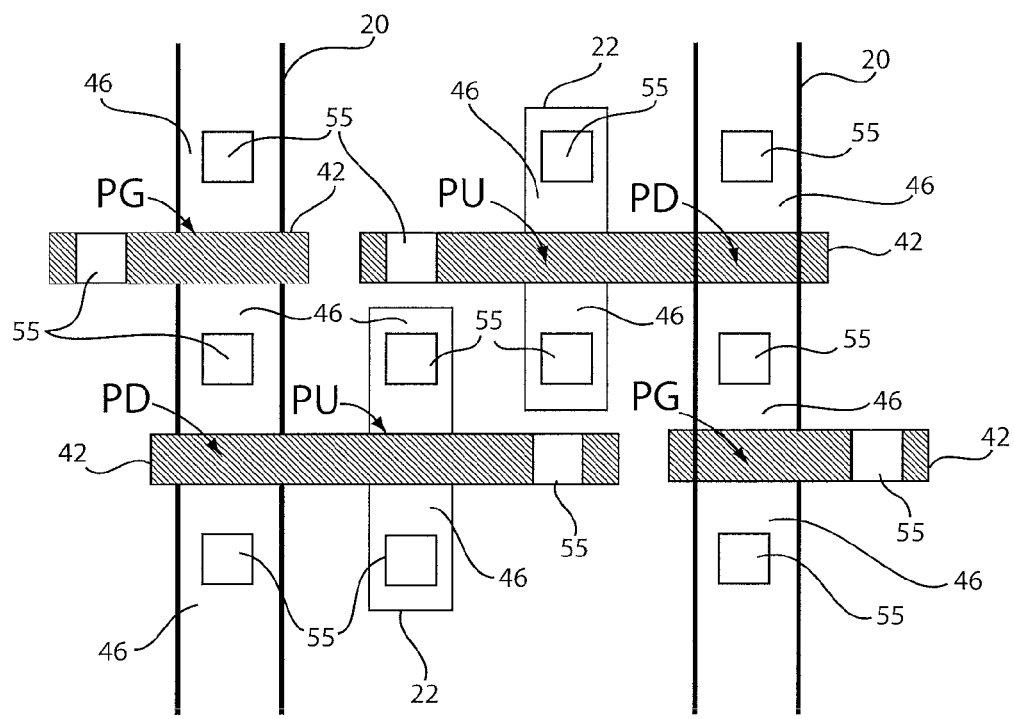
FIG. 6 is a top view of a semiconductor device (e.g., SRAM) shows a layout of NFETs and PFETs using long and short fins in accordance with an illustrative embodiment.

Referring to FIG. 6, the present principles are well-suited for regular structures such as SRAM memory cells or other devices. For example, in an SRAM cell, both pull-down (PD) and pass-gate (PG) NFET devices are fabricated on long and narrow Si structures 20, while pull-up (PU) PFETs are fabricated on small islands 22. Hence, no additional processing is needed and desired strain is achieved for both NFETs and PFETs on a same SSDOI wafer. Contacts 55 are provided down to source/drain regions 46 and to gate conductors 42.

While strain level in state-of-the-art uniaxially strained NFETs is limited to about 0.5%, the present principles offer strain levels of 1% or above and can potentially lead to an increase in the NFET performance, e.g., 2× or greater performance. Moreover, unlike current local strain engineering methods that loose their effectiveness as the device pitch is scaled, the present principles are extendable to future technology nodes.

Figure 7:
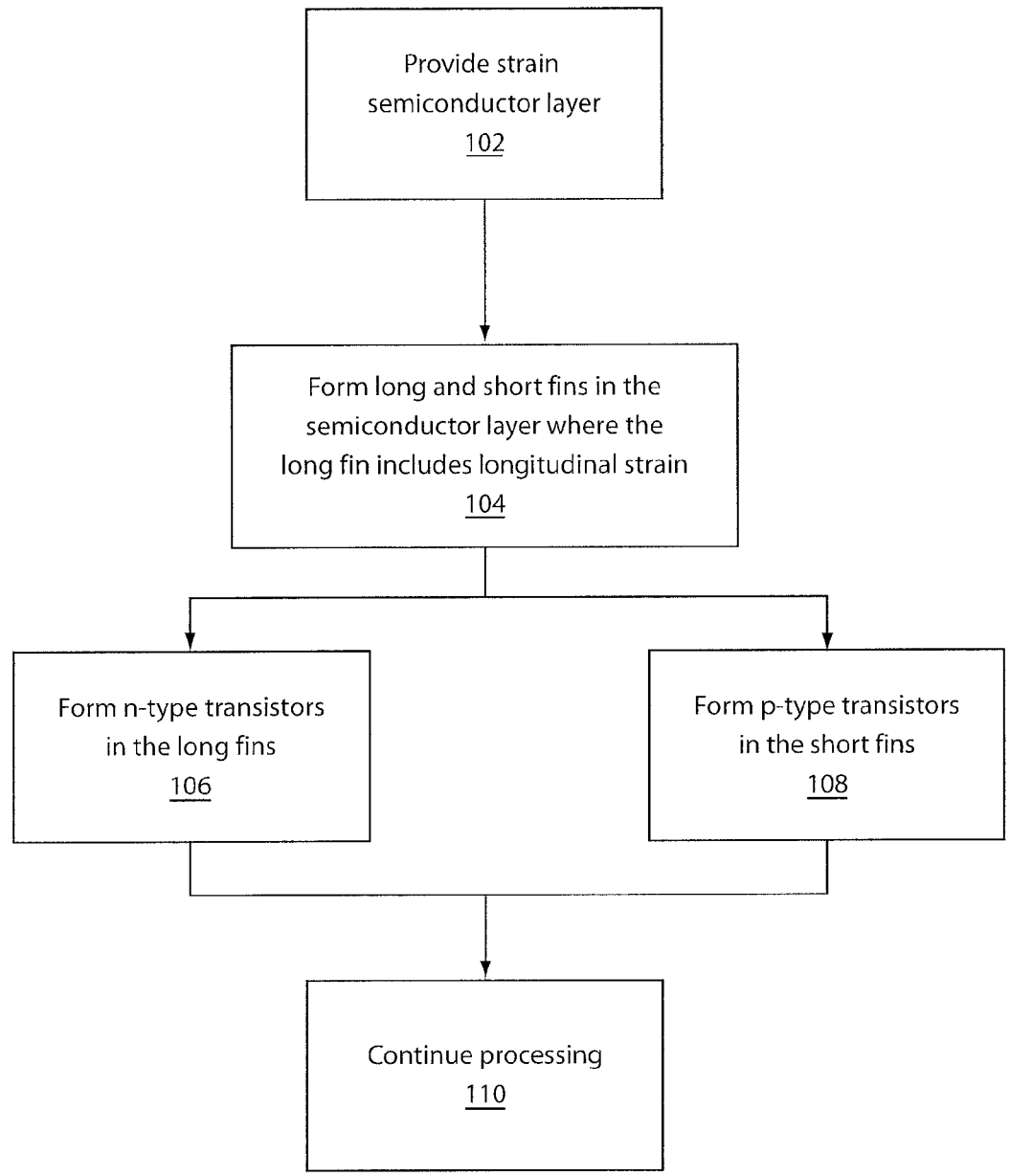
FIG. 7 is a flow diagram showing an illustrative method for fabricating a semiconductor device beneficially employing strain for both n-type and p-type transistors on a same chip.

Referring to FIG. 7, a flow diagram illustratively showing a method for fabricating a semiconductor device in accordance with the present principles is shown. In block 102, a strained semiconductor layer having a strain in at least one axis is provided. The strained semiconductor layer may be included on a Strained Silicon Directly on Insulator (SSDOI) wafer with biaxial tensile strain. Other strained substrates may also be employed. In one embodiment, the long fin includes a strain of at least 1%, and the short fin includes a negligible strain (e.g., 0.2% or less).

In block 104, at least one long fin and at least one short fin are formed in the semiconductor layer such that the at least one long fin has a strained length along the at least one axis. The formation of the fins may include lithographic patterning, sidewall (or spacer) image transfer (SIT) or another other masking and etching techniques. It should be understood that the fins may be formed anywhere on the semiconductor layer and are not limited by layout optimization based on strain fields. The long fin(s) preferably include a length of at least 1 micron. This dimension may be reduced depending on the technology (scale) that is being employed. The long fin(s) are employed with n-type transistors and preferably include a length extending at least about 500 nm from each side of a position location of the n-type transistor. The short fins may include a length of less than 300 nm. The width and height of the fins may be determined based upon the semiconductor layer thickness the technology being employed and/or the desired device density, among other things.

In block 106, an n-type transistor is fanned on the at least one long fin, and, in block 108, a p-type transistor is formed on the at least one short fin. The transistor formation may be performed simultaneously or in any order. The transistor formation preferably includes forming gate structures wherein the gate structures maintain strain in the long fins. Further, raised source and drain regions may be employed in forming the transistors. The raised source and drain regions preferably also maintain strain in the long fins. In block 110, processing continues to complete the semiconductor device. The semiconductor device may include any number of devices, may include static random access memory (SRAM), dynamic random access memory, any CMOS device, any device with PFETs and NFETs on a same substrate, etc. In a particularly useful embodiment, an SRAM device includes pull-down (PD) and pass-gate (PG) n-type transistors on long fins, and pull-up (PU) p-type transistors on short fins (see FIG. 6). Further processing may include stressing PFETs by other methods, e.g., stress liners or embedded SiGe, etc.

Having described preferred embodiments for strained CMOS device, circuit and method of fabrication (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a semiconductor device, comprising:
    providing a strained semiconductor layer having a strain in at least one axis;
    forming at least one long fin and at least one short fin in the semiconductor layer such that the at least one long fin has a strained length along the at least one axis;
    forming an n-type transistor on the at least one long fin; and
    forming a p-type transistor on the at least one short fin.

2. The method as recited in claim 1, wherein forming the at least one long fin includes forming a long fin with a length of about 1 micron.

3. The method as recited in claim 1, wherein forming the at least one long fin includes forming a long fin with a length extending at least about 500 nm from each side of a position location of an n-type transistor.

4. The method as recited in claim 1, wherein forming the at least one short fin includes forming a short fin with a length of at less than 300 nm.

5. The method as recited in claim 1, wherein providing a strained semiconductor layer includes providing a Strained Silicon Directly on Insulator (SSDOI) wafer with biaxial tensile strain.

6. The method as recited in claim 1, further comprising forming gate structures wherein the gate structures maintain strain in the at least one long fin.

7. The method as recited in claim 1, further comprising forming raised source and drain regions wherein the raised source and drain regions maintain strain in the at least one long fin.

8. The method as recited in claim 1, wherein the semiconductor device includes a static random access memory, and the method further comprising forming pull-down (PD) and pass-gate (PG) n-type transistors on long fins, and pull-up (PU) p-type transistors on short fins.

9. The method as recited in claim 1, wherein the at least one long fin includes a strain of at least 1% and the at least one short fin includes a negligible strain.

10. A method for fabricating a semiconductor device, comprising:
    providing a providing a Strained Silicon Directly on Insulator (SSDOI) wafer with biaxial tensile strain;
    patterning long fins and short fins in a semiconductor layer of the wafer such that the long fin has a strained length along its longitudinal axis, and the short fins having dimensions to substantially remove residual strain;
    forming n-type transistors on the long fins including gate structures and raised active area regions such that the gate structures and the raised active area regions provide anchoring to maintain strain in the strain length of the long fins; and
    forming p-type transistors on the short fins.

11. The method as recited in claim 10, wherein forming the long fins includes forming a long fin with a length of about 1 micron.

12. The method as recited in claim 10, wherein forming the long fins includes forming a long fin with a length extending at least about 500 nm from each side of a position location of an n-type transistor.

13. The method as recited in claim 10, wherein forming the short fin includes forming a short fin with a length of at less than 300 nm.

14. The method as recited in claim 10, wherein the semiconductor device includes a static random access memory, and the method further comprising forming pull-down (PD) and pass-gate (PG) n-type transistors on long fins, and pull-up (PU) p-type transistors on short fins.

15. The method as recited in claim 10, wherein the long fins include a strain of at least 1%.

16. A semiconductor device, comprising:
    a strained semiconductor layer formed into at least one long fin and at least one short fin such that the at least one long fin has a strained length;
    an n-type transistor formed on the at least one long fin wherein the strained length improves device operation; and
    a p-type transistor formed on the short fin.

17. The device as recited in claim 16, wherein the at least one long fin includes a length of about 1 micron.

18. The device as recited in claim 16, wherein the at least one long fin includes a length extending at least about 500 nm from each side of a position location of an n-type transistor.

19. The device as recited in claim 16, wherein the at least one short fin includes a length of less than 300 nm.

20. The device as recited in claim 16, wherein the strained semiconductor layer includes a Strained Silicon Directly on Insulator (SSDOI) wafer with biaxial tensile strain.

21. The device as recited in claim 16, wherein the n-type transistors include gate structures and the gate structures maintain strain in the at least one long fin.

22. The device as recited in claim 16, wherein the n-type transistors include raised source and drain regions wherein the raised source and drain regions maintain strain in the at least one long fin.

23. The device as recited in claim 16, wherein the semiconductor device includes a static random access memory having pull-down (PD) and pass-gate (PG) n-type transistors on long fins, and pull-up (PU) p-type transistors on short fins.

24. The device as recited in claim 16, wherein the at least one long fin includes a strain of at least 1%.

* * * * *